United States Patent
Liu et al.

(10) Patent No.: US 9,510,456 B2
(45) Date of Patent: Nov. 29, 2016

(54) TRANSPARENT CONDUCTOR AND PREPARATION METHOD THEREOF

(71) Applicant: SHENZHEN O-FILM TECH CO., LTD., Shenzhen, Guangdong (CN)

(72) Inventors: Wei Liu, Shenzhen (CN); Genchu Tang, Shenzhen (CN); Wei Gong, Shenzhen (CN); Bin Tang, Shenzhen (CN); Zhizheng Cheng, Shenzhen (CN)

(73) Assignee: Shenzhen O-Film Tech Co., Ltd., Shenzhen, Guangdong (CN)

( * ) Notice: Subject to any disclaimer, the term of this patent is extended or adjusted under 35 U.S.C. 154(b) by 542 days.

(21) Appl. No.: 14/000,142

(22) PCT Filed: Dec. 20, 2012

(86) PCT No.: PCT/CN2012/087075
§ 371 (c)(1),
(2) Date: Aug. 16, 2013

(87) PCT Pub. No.: WO2014/071669
PCT Pub. Date: May 15, 2014

(65) Prior Publication Data
US 2014/0131067 A1    May 15, 2014

(30) Foreign Application Priority Data
Nov. 9, 2012 (CN) .......................... 2012 1 0447836

(51) Int. Cl.
*H05K 1/09* (2006.01)
*H05K 3/00* (2006.01)
(Continued)

(52) U.S. Cl.
CPC ................ *H05K 3/00* (2013.01); *H05K 3/048* (2013.01); *H05K 3/1258* (2013.01); *H05K 3/28* (2013.01);
(Continued)

(58) Field of Classification Search
CPC ...... H05K 3/00; H05K 3/048; H05K 3/1258; H05K 3/28; H05K 2201/0108; H05K 2203/0568
USPC .................. 174/251, 250, 253, 255–258, 261
See application file for complete search history.

(56) References Cited

U.S. PATENT DOCUMENTS

| 4,765,729 A | 8/1988 | Taniguchi |
| 6,078,139 A | 6/2000 | Ochiai et al. |

(Continued)

FOREIGN PATENT DOCUMENTS

| CN | 2429326 Y | 5/2001 |
| CN | 1653561 A | 8/2005 |

(Continued)

OTHER PUBLICATIONS

Office Action in corresponding Japanese Application No. 2014-545089; dated Mar. 23, 2015; 3 pages.
(Continued)

*Primary Examiner* — Tremesha S Willis
(74) *Attorney, Agent, or Firm* — Haynes Beffel & Wolfeld LLP (57) ABSTRACT

A transparent conductor includes a transparent substrate, a conductive mesh, and an insulating protective layer, which are laminated in that order, wherein the conductive mesh is formed on the transparent substrate, and a surface of the insulating protective layer away from the transparent substrate is flat. Such transparent conductor avoids the use of indium tin oxide, thus the cost of the transparent conductors is lower. A method of preparing the transparent conductor is also provided.

4 Claims, 5 Drawing Sheets

(51) Int. Cl.
   *H05K 3/04*    (2006.01)
   *H05K 3/12*    (2006.01)
   *H05K 3/28*    (2006.01)

(52) U.S. Cl.
   CPC ............... *H05K 2201/0108* (2013.01); *H05K 2201/09681* (2013.01); *H05K 2203/0568* (2013.01); *H05K 2203/1344* (2013.01)

(56) References Cited

U.S. PATENT DOCUMENTS

| | | | |
|---|---|---|---|
| 6,086,979 | A | 7/2000 | Kanbara et al. |
| 6,197,408 | B1 | 3/2001 | Kanbara et al. |
| 6,210,787 | B1 | 4/2001 | Goto et al. |
| 6,297,811 | B1 | 10/2001 | Kent et al. |
| 6,433,481 | B1 | 8/2002 | Marutsuka |
| 7,521,123 | B2 | 4/2009 | Hattori et al. |
| 7,920,129 | B2 | 4/2011 | Hotelling et al. |
| 7,931,518 | B2 | 4/2011 | Kotsubo et al. |
| 8,143,771 | B2 | 3/2012 | Shin et al. |
| 8,242,670 | B2 | 8/2012 | Kim et al. |
| 2004/0239650 | A1 | 12/2004 | Mackey |
| 2005/0170158 | A1 | 8/2005 | Hattori et al. |
| 2006/0097991 | A1 | 5/2006 | Hotelling et al. |
| 2006/0141243 | A1 | 6/2006 | Ibuki |
| 2008/0062140 | A1 | 3/2008 | Hotelling et al. |
| 2009/0045163 | A1 | 2/2009 | Lambertini et al. |
| 2009/0219258 | A1 | 9/2009 | Geaghan et al. |
| 2010/0123670 | A1 | 5/2010 | Philipp |
| 2010/0156840 | A1* | 6/2010 | Frey .................. G06F 3/044 345/174 |
| 2011/0019278 | A1 | 1/2011 | Aoki |
| 2011/0027577 | A1 | 2/2011 | Tanaka et al. |
| 2011/0032196 | A1 | 2/2011 | Feng et al. |
| 2011/0043465 | A1 | 2/2011 | Huang et al. |
| 2011/0050605 | A1 | 3/2011 | Pan et al. |
| 2011/0102370 | A1 | 5/2011 | Kono et al. |
| 2011/0109590 | A1 | 5/2011 | Park |
| 2011/0132670 | A1 | 6/2011 | Yeh et al. |
| 2011/0210935 | A1 | 9/2011 | Chuang |
| 2011/0221704 | A1 | 9/2011 | Kurokawa et al. |
| 2011/0242019 | A1 | 10/2011 | Jeong et al. |
| 2011/0260741 | A1 | 10/2011 | Weaver et al. |
| 2011/0300908 | A1 | 12/2011 | Grespan et al. |
| 2012/0097424 | A1 | 4/2012 | Jo et al. |
| 2012/0199462 | A1 | 8/2012 | Hsu |
| 2012/0223049 | A1 | 9/2012 | Yoshikawa et al. |
| 2012/0313877 | A1 | 12/2012 | Han |
| 2012/0319974 | A1 | 12/2012 | Kim et al. |
| 2012/0327569 | A1 | 12/2012 | Park et al. |
| 2013/0000959 | A1 | 1/2013 | Park et al. |
| 2013/0021289 | A1 | 1/2013 | Chen et al. |
| 2013/0050104 | A1 | 2/2013 | Lee et al. |
| 2013/0169548 | A1 | 7/2013 | Kim et al. |
| 2013/0194198 | A1 | 8/2013 | Guard et al. |
| 2014/0070821 | A1 | 3/2014 | Cheng et al. |
| 2014/0111442 | A1* | 4/2014 | Cok .................. G06F 3/044 345/173 |
| 2014/0111708 | A1 | 4/2014 | Cheng et al. |
| 2014/0216803 | A1 | 8/2014 | Cheng et al. |

FOREIGN PATENT DOCUMENTS

| | | | |
|---|---|---|---|
| CN | 101276079 | A | 10/2008 |
| CN | 101320687 | A | 12/2008 |
| CN | 101492151 | A | 7/2009 |
| CN | 101604634 | A | 12/2009 |
| CN | 101610948 | A | 12/2009 |
| CN | 101968697 | A | 2/2011 |
| CN | 101976146 | A | 2/2011 |
| CN | 102112949 | A | 6/2011 |
| CN | 102124427 | A | 7/2011 |
| CN | 102216891 | A | 10/2011 |
| CN | 102279682 | A | 12/2011 |
| CN | 102279686 | A | 12/2011 |
| CN | 102722279A | A | 10/2012 |
| JP | H11-339574 | A | 12/1999 |
| JP | 2001091926 | A | 4/2001 |
| JP | 2006100458 | A | 4/2006 |
| JP | 2007018226 | A | 1/2007 |
| JP | 2007285026 | A | 11/2007 |
| JP | 2007319606 | A | 12/2007 |
| JP | 2008083491 | A | 4/2008 |
| JP | 2008083497 | A | 4/2008 |
| JP | 2008103849 | A | 5/2008 |
| JP | 2009266953 | | 11/2009 |
| JP | 2010039537 | A | 2/2010 |
| JP | 2010243742 | | 10/2010 |
| JP | 2011005793 | A | 1/2011 |
| JP | 2011044137 | A | 3/2011 |
| JP | 2011059771 | A | 3/2011 |
| JP | 2011059772 | A | 3/2011 |
| JP | 2011096225 | A | 5/2011 |
| JP | 2011129527 | A | 6/2011 |
| JP | 2011211700 | A | 10/2011 |
| JP | 2012018634 | A | 1/2012 |
| JP | 3174557 | | 3/2012 |
| JP | 2012053644 | A | 3/2012 |
| JP | 2012108844 | A | 6/2012 |
| JP | 2012133580 | A | 7/2012 |
| JP | 2012138310 | A | 7/2012 |
| KR | 20100095988 | A | 9/2010 |
| KR | 20110051208 | A | 5/2011 |
| KR | 20120018059 | A | 2/2012 |
| TW | 405011 | B | 9/2000 |
| TW | 408745 | U | 10/2000 |
| TW | 200945129 | A | 11/2009 |
| TW | 201115220 | A | 5/2011 |
| TW | M412413 | U | 9/2011 |
| TW | 201145125 | A | 12/2011 |
| TW | 201218056 | A | 5/2012 |
| TW | 201232632 | A | 8/2012 |
| TW | 201234243 | A | 8/2012 |
| WO | 2007008518 | A2 | 1/2007 |
| WO | 2011111748 | A1 | 9/2011 |
| WO | 2011156447 | A1 | 12/2011 |

OTHER PUBLICATIONS

JP Application No. 2014-510653—Office Action dated Jul. 1, 2014; 5 pgs.
JP Application No. 2014-510652—Office Action dated Sep. 1, 2014; 2 pgs.
JP Application No. 2014-531099—Office Action dated Oct. 10, 2014; 4 pgs.
JP Application No. 2014-531099—Office Action dated May 7, 2015; 4 pgs.
TW Application No. 102130154—Office Action dated Apr. 8, 2015; 6 pgs.
JP Application No. 2014-531098—Office Action dated Sep. 8, 2015; 4 pgs.
TW Application No. 102130153—Office Action dated Jul. 14, 2015; 5 pgs.
CN Application No. 201210116164.1—Office Action dated Sep. 28, 2014; 4 pgs.
JP Application No. 2014-510654—Office Action dated Sep. 30, 2014; 4 pgs.
CN Application No. 201210116181.5—Office Action dated Mar. 16, 2015; 8 pgs.
U.S. Appl. No. 14/000,178—Non Final Office action dated Jan. 30, 2015, 12 pages.
U.S. Appl. No. 14/000,178—Non Final Office action dated Aug. 4, 2015, 11 pages.
U.S. Appl. No. 14/000,174—Non Final Office action dated Mar. 20, 2015, 20 pages.
U.S. Appl. No. 14/000,174—Final Office action dated Jul. 2, 2015, 22 pages.
U.S. Appl. No. 14/000,163—Non Final Office action dated Mar. 12, 2015, 15 pages.
U.S. Appl. No. 14/000,163—Final Office action dated Jul. 14, 2015, 16 pages.

(56) References Cited

OTHER PUBLICATIONS

U.S. Appl. No. 14/000,157—Non Final Office action dated Jul. 2, 2015, 39 pages.
U.S. Appl. No. 14/000,152—Non Final Office action dated Jan. 5, 2015, 10 pages.
U.S. Appl. No. 14/000,152—Final Office action dated Apr. 9, 2015, 10 pages.
KR Application No. 20147008151—Office Action dated Mar. 27, 2014, 4 pages.
PCT/CN/20121087082—International Search Report dated Apr. 4, 2013, 25 pages. (WO 2013/155852).
U.S. Appl. No. 14/000,163—Non Final Office Action dated Nov. 6, 2015, 13 pages.
U.S. Appl. No. 14/000,157—Final Office Action dated Oct. 22, 2015, 25 pages.
KR Application No. 20147008156—Office Action dated Sep. 2, 2015, 5 pages.
PCT/CN2012/087083—International Search Report dated Jun. 6, 2013, 18 pages (WO 2014/029183).
Office Action in corresponding Taiwan Application No. 102130719; dated Jan. 8, 2015; 6 pages.
PCT/CN2012/087075—International Search Report dated Jul. 18, 2013, 6 pages.
Yan, C. et al., Mechanical and Environmental Stability of Polymer Thin-Film-Coated Graphene. ACS nano, 6(3), 2096-2103.
U.S. Appl. No. 14/000,157—Reponse to Final Office Action dated Oct. 22, 2015, filed Nov. 13, 2015, 8 pages.
U.S. Appl. No. 14/000,157—Response to Office Action dated Jul. 2, 2015, filed Sep. 15, 2015, 9 pages.
U.S. Appl. No. 14/000,157—Advisory Action dated Nov. 30, 2015, 3 pgs.
U.S. Appl. No. 14/000,174—Office Action dated Dec. 21, 2015, 18 pages.
U.S. Appl. No. 14/000,163—Office Action dated Feb. 19, 2015, 15 pgs.
U.S. Appl. No. 14/000,163—Response to Office Action dated Nov. 6, 2015, filed Jan. 11, 2016, 10 pages.
U.S. Appl. No. 14/000,163—Response to Final Office action dated Jul. 14, 2015, filed Oct. 13, 2015, 6 pages.
U.S. Appl. No. 14/000,163—Response to Office Action dated Mar. 12, 2015, filed May 29, 2015, 8 pages.
U.S. Appl. No. 14/000,174—Office Action dated Feb. 19, 2016, 16 pgs.
U.S. Appl. No. 14/000,174—Response to Office Action dated Dec. 21, 2015, filed Jan. 25, 2016, 7 pages.
U.S. Appl. No. 14/000,174—Response to Office Action dated Mar. 20, 2015, filed May 19, 2015, 12 pages.
U.S. Appl. No. 14/000,178—Response to Office Action dated Aug. 4, 2015, filed Oct. 28, 2015, 6 pages.
U.S. Appl. No. 14/000,178—Response to Office Action dated Jan. 30, 2015, filed Apr. 29, 2015, 5 pages.
U.S. Appl. No. 14/000,178—Notice of Allowance dated Jan. 20, 2016, 11 pages.
CN 201210447836.7—Office Action dated Sep. 2, 2015, 5 pages.
KR 1020147008183 Office Action dated Jun. 25, 2015, 6 pages.
KR 1020147008183 Office Action dated Dec. 15, 2015, 4 pages.
JP 2014545089—Office Action dated Apr. 20, 2016, 3 pages.
JP 2014545089—Office Action dated Jan. 1, 2016, 3 pages.

* cited by examiner

TRANSPARENT CONDUCTOR AND PREPARATION METHOD THEREOF

FIELD OF THE INVENTION

The present invention relates to a transparent conductor and preparation method thereof.

BACKGROUND OF THE INVENTION

In recent years, the capacitive touch screen has become more and more favored by the market due to its high transparency, multi-touch, long life and other advantages. Currently, the transparent conductive material indium tin oxide (ITO) is coated on PET or a glass substrate by vacuum evaporation or magnetron sputtering to form a transparent conductor and the capacitive touch screen.

However, indium is a rare metal, which has a relatively small nature reserve, and its price is very expensive, such that the cost of the transparent conductor is very high.

SUMMARY OF THE INVENTION

In one aspect of the present invention, it is desired to provide a low cost transparent conductor and its preparation method.

A transparent conductor includes a transparent substrate, a conductive mesh, and an insulating protective layer, which are laminated in that order, wherein the conductive mesh is formed on the transparent substrate, and a surface of the insulating protective layer away from the transparent substrate is flat.

In one embodiment, the conductive mesh is made of at least one selected from the group consisting of metal, metal alloy, carbon nanotube, graphene, and conducting polymer.

In one embodiment, the transparent substrate is made of at least one selected from the group consisting of glass, polymethyl methacrylate, and polyethylene terephthalate.

In one embodiment, the conductive mesh is composed of a plurality of conductive wires.

In one embodiment, the insulating protective layer is made of at least one selected from the group consisting of thermoplastic polymer, a thermosetting polymer, or UV curable polymer.

A method of preparing a transparent conductor includes the following steps:

coating a photoresist on a surface of a transparent substrate to form a photoresist layer;

exposing and developing the photresist layer using a mask to form a meshed pattern on the photoresist layer;

filling a conductive material into the pattern, curing the conductive material to obtain a conductive mesh;

removing the photoresist layer by a remover; and coating an insulating protective material on a surface of the conductive mesh by a wet coating process, curing the insulating protective material to form a insulating protective layer, and a surface of the insulating protective layer away from the transparent substrate is flat.

In one embodiment, the liquid conductive material is filled into the pattern by scraping or spraying.

In one embodiment, the conductive material is at least one selected from the group consisting of metal, metal alloy, carbon nanotube, graphene, and conducting polymer.

In one embodiment, the transparent substrate is made of at least one selected from the group consisting of glass, polymethyl methacrylate, and polyethylene terephthalate.

In one embodiment, the insulating protective layer is made of at least one selected from the group consisting of thermoplastic polymer, a thermosetting polymer, or UV curable polymer.

The transparent conductor and its preparing method avoids the use of indium tin oxide, thus cost of the transparent conductor is lower. Since the insulating protective layer is formed on the surface of the conductive mesh, the conductive mesh is protected from being scratched.

DETAILED DESCRIPTION

The invention will be described in further detail below in conjunction with the drawing. Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein", "above", "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

Figure 1:
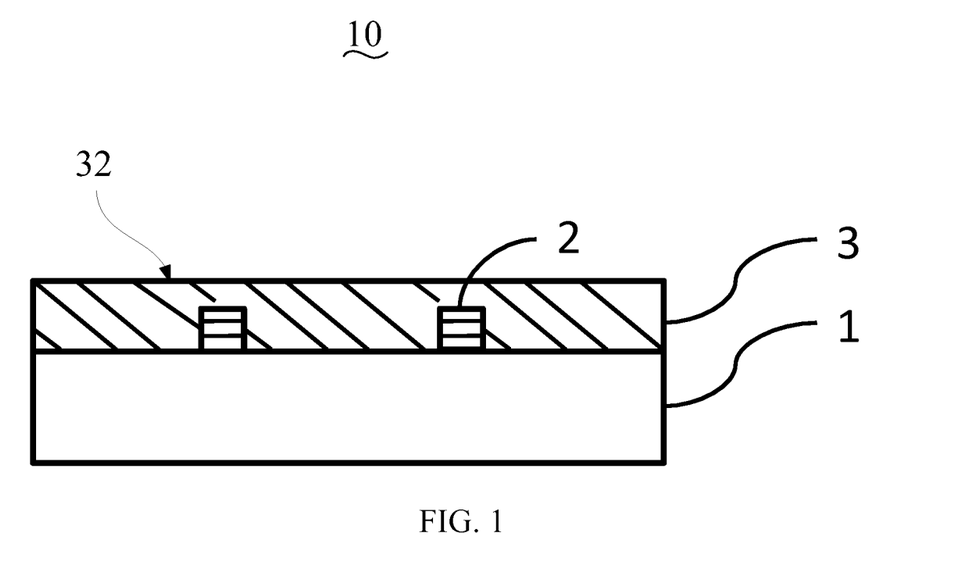
FIG. 1 is a schematic view of an embodiment of a transparent conductor.

Referring to FIG. 1, an embodiment of a transparent conductor 10 includes a transparent substrate 1, a conductive mesh 2, and an insulating protective layer 3, which are laminated in that order.

The transparent substrate 1 is substantially a sheet made of optically transparent material selected from the group consisting of glass, polymethyl methacrylate (PMMA), and polyethylene terephthalate (PET). Preferably, a thickness of the transparent substrate 1 ranges from 50 μm to 700 μm, more preferably from 50 μm to 300 μm.

The conductive mesh 2 is formed on a surface of the transparent substrate 1. The conductive mesh is made of at least one selected from the group consisting of metal, metal alloy, carbon nanotube, graphene, and conducting polymer. The thickness of the conductive mesh 2 is from 10 μm to 10 μm, preferably from 2 μm to 5 μm.

Figure 2:
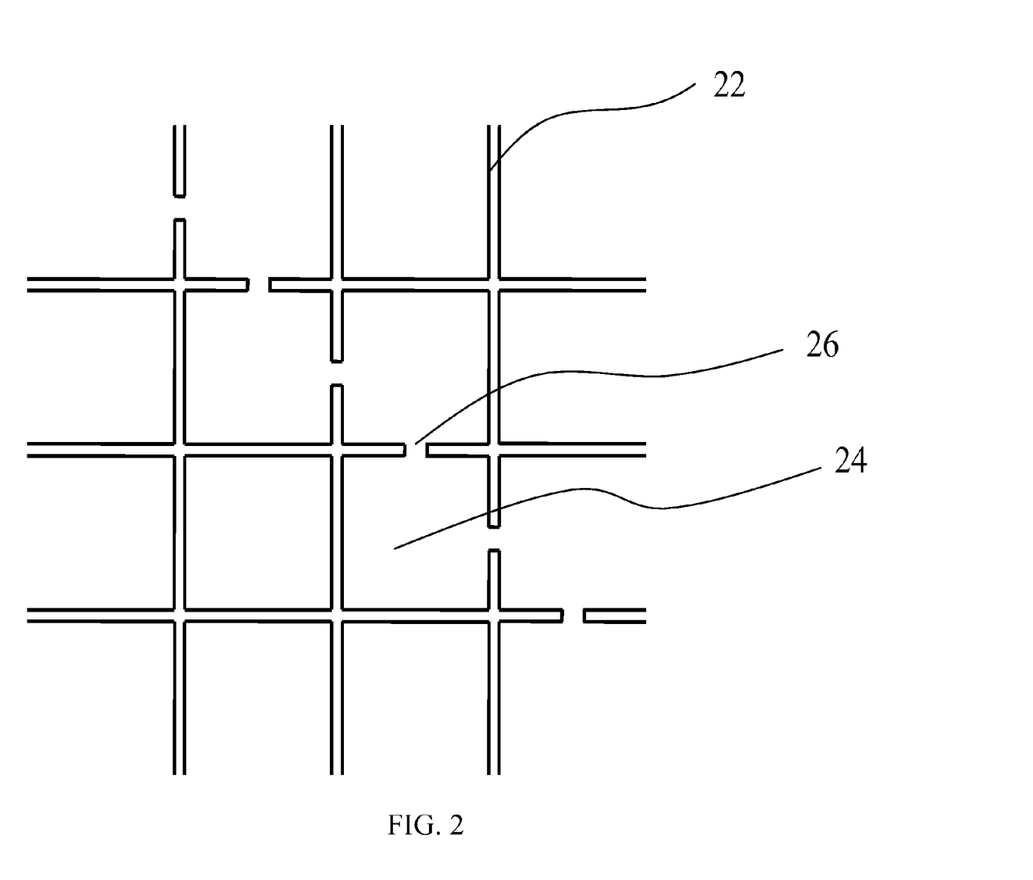
FIG. 2 is a schematic view of the conductive mesh of the transparent conductor of FIG. 1.
Figure 3:
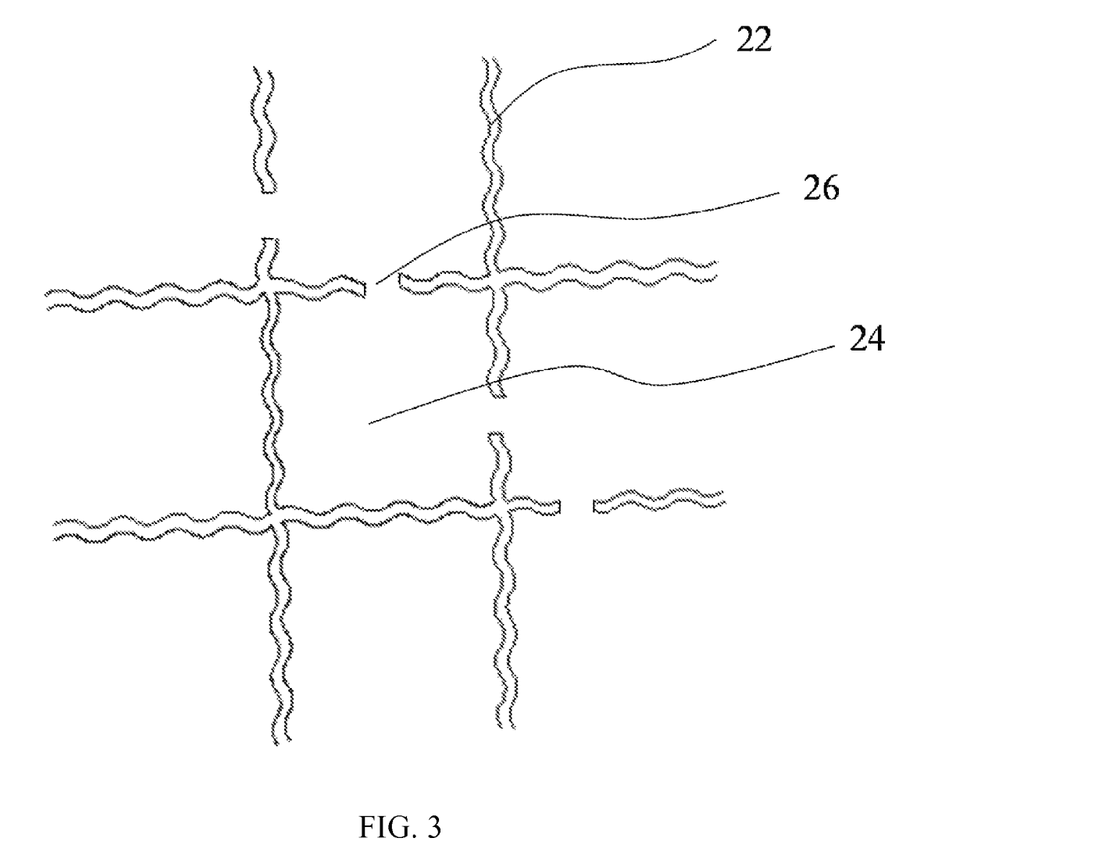
FIG. 3 is a schematic view of the conductive mesh of another embodiment of a transparent conductor.

Referring to FIG. 2 and FIG. 3, the conductive mesh 2 is formed by arranging a plurality of conductive wires 22. As shown in FIG. 2, the conductive wire 22 is straight. In alternative embodiment, the conductive wire 22 can also be curve, as can be seen in FIG. 3. It is noted that, the conductive wire 22 may not be limited to the shape shown in FIG. 2 and FIG. 3, it can also be other soft irregular lines.

Preferably, the thickness of the conductive wire 22 ranges from 0.2 μm to 5 μm, more preferably from 0.5 μm to 2 μm. The distance between two adjacent conductive wires 22 ranges from 50 μm to 800 μm. It should be noted that, the density and thickness of the conductive wires may be alternatively designed according to the required transmittance and sheet resistance. The plurality of conductive wires 22 are arranged in cross to form a plurality of voids 24 arranged in an array. The plurality of voids 24 may have different or the same shapes and sizes. The shape of the void 24 may be square, rectangular, triangular, diamond or polygonal. It is to be noted that, according to the demands, the conductive wires 22 may be performed a disconnection process, i.e., cutting one or more conductive wires 22 to form a notch 26, such that one conductive wire 22 is divided into two, and two adjacent voids 24 are communicated by the notch 26. By disconnections, the whole network can be split into separate channels, which do not interfere with each other, thus the single multi-point and other relevant technical requirements are met.

Referring to FIG. 1 again, the insulating protective layer 3 is formed on a surface of the conductive mesh 2, and a surface 32 of the insulating protective layer 3 away from the transparent substrate 1 is flat. The insulating protective layer is made of at least one selected from the group consisting of thermoplastic polymer, a thermosetting polymer, or a UV curable polymer. The surface 32 has a flatness of 0.1-1 μm/mm², preferably, 0.2-0.5 μm/mm².

In order not to affect the conductivity of the conductive mesh 2, a distance between the surface 32 of the insulating protective layer 3 and a surface of the conductive mesh 2 away from the transparent substrate 1 is less than 10 μm, preferably, less than 5 μm.

By forming the conductive mesh 2 on the surface of the transparent substrate, the transparent conductor 10 avoids the use of indium tin oxide, thus the cost of the transparent conductor 10 is lower. Since the insulating protective layer 3 is formed on the surface of the conductive mesh 2, the conductive mesh 2 is protected from being scratched.

Figure 4:
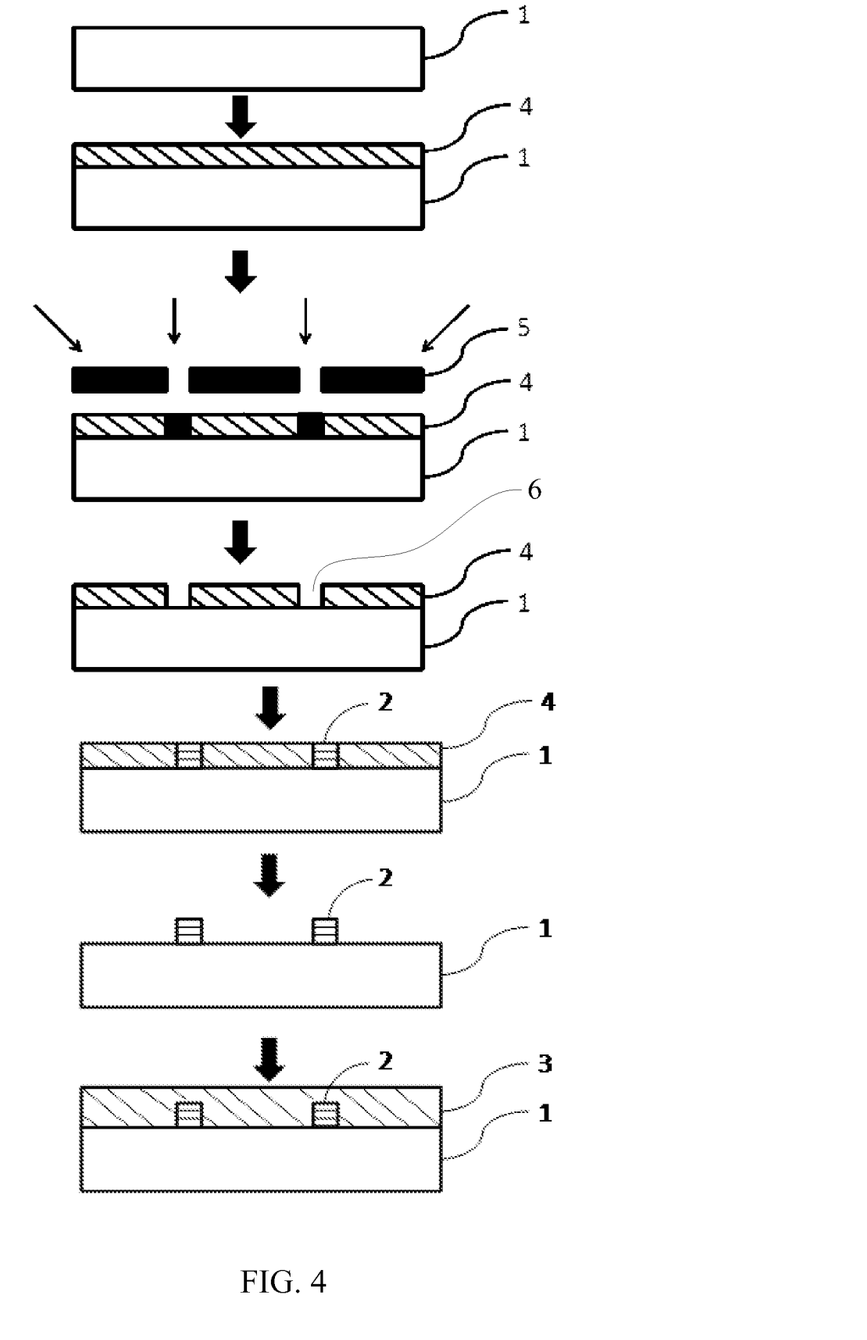
FIG. 4 illustrates a process sequence of a method for preparing another embodiment of a transparent conductor.
Figure 5:
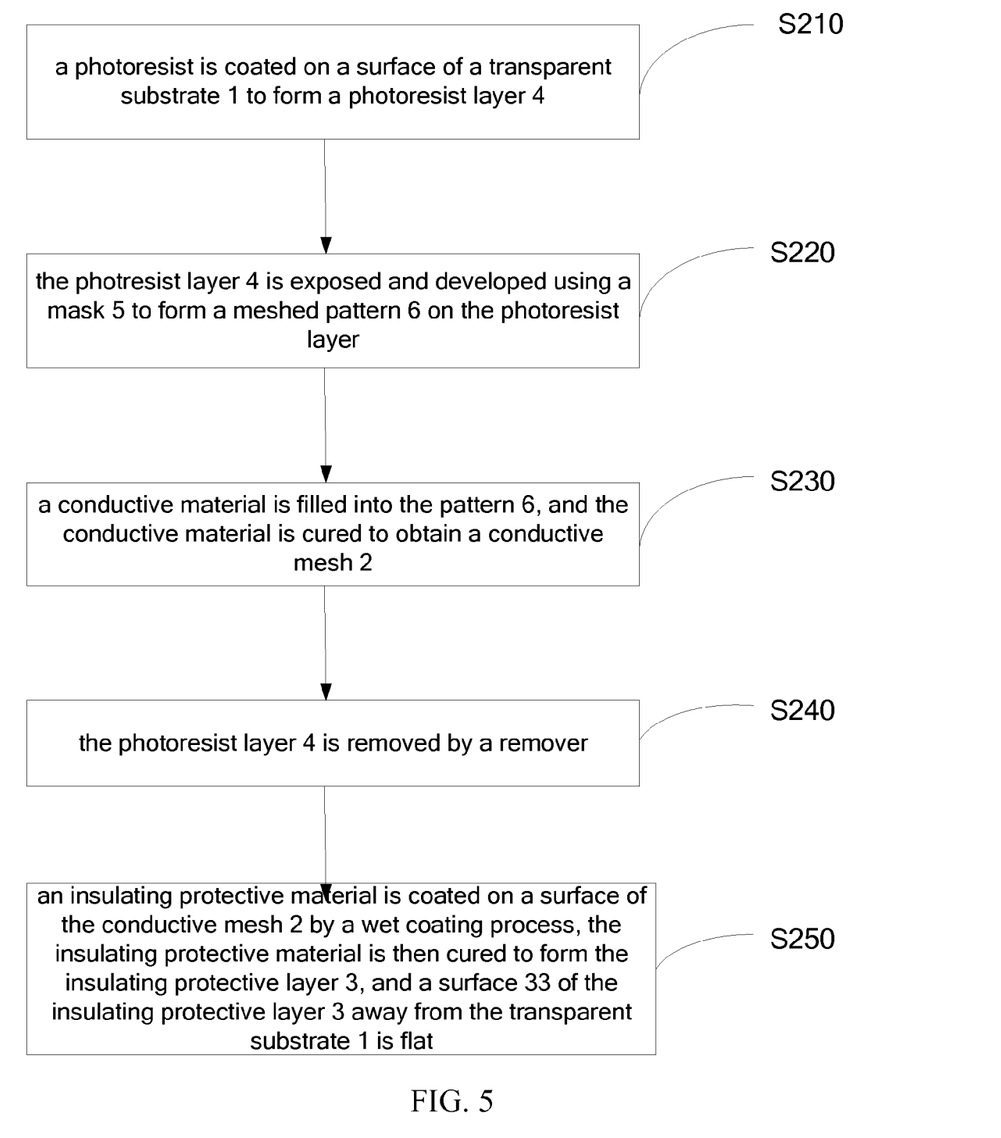
FIG. 5 is a flow chart of a method for preparing another embodiment of a transparent conductor.

Referring to FIG. 1 through FIG. 5, a preparation method of the described transparent conductor 10 includes the following steps:

Step S210, a photoresist is coated on a surface of a transparent substrate 1 to form a photoresist layer 4.

The transparent substrate 1 is substantially a sheet made of optically transparent material selected from the group consisting of glass, polymethyl methacrylate (PMMA), and polyethylene terephthalate (PET). Preferably, the thickness of the transparent substrate 1 is from 50 μm to 700 μm, more preferably from 50 μm to 300 μm.

The photoresist layer 4 has a thickness of 1 μm to 10 μm, preferably, 2 μm to 5 μm.

Step S220, the photoresist layer 4 is exposed and developed using a mask 5 to form a meshed pattern 6 on the photoresist layer.

The pattern 6 is formed by a plurality of channels defined on the photoresist layer 4, which are arranged as a network. It is to been noted that, the shape of the pattern 6 depends on the desired shape of the conductive mesh 2 to be prepared.

Step S230, a conductive material is filled into the pattern 6, and the conductive material is cured to obtain a conductive mesh 2.

The conductive material is at least one selected from the group consisting of metal, metal alloy, carbon nanotube, graphene, and conducting polymer.

In the illustrated embodiment, the liquid conductive material is filled into the pattern 6 by scraping or spraying.

The conductive mesh 2 is formed by arranging a plurality of conductive wires 22. As shown in FIG. 2, the conductive wire 22 is a straight line. In alternative embodiment, the conductive wire 22 may be a curve, as can be seen in FIG. 3. It is noted that, the conductive wire 22 may not be limited to the shape shown in FIG. 2 and FIG. 3, it can also be other soft irregular lines.

Preferably, the thickness of the conductive wire 22 is from 0.2 μm to 5 μm, more preferably from 0.5 μm to 2 μm. The distance between two adjacent conductive wires 22 may be from 50 μm to 800 μm. It should be noted that, the density and thickness of the conductive wires may be alternatively designed according to the required transmittance and sheet resistance.

The plurality of conductive wires 22 are arranged in cross to form a plurality of voids 24 arranged in an array. The plurality of voids 24 may have different or the same shapes and sizes. The shape of the void 24 may be square, rectangular, triangular, diamond or polygonal. It is to be noted that, according to the demands, the conductive wires 22 may be performed a disconnection process, i.e., cutting one or more conductive wires 22 to form a notch 26, such that one conductive wire 22 is divided into two, and two adjacent voids 24 are communicated by the notch 26. By disconnections, the whole network can be split into separate channels, which do not interfere with each other, thus the single multi-point and other relevant technical requirements are met.

Step S240, the photoresist layer 4 is removed by a remover.

It is to be noted that, when filling the liquid conductive material into the pattern 6 by scraping or spraying, a portion of the conductive material may be coated on a surface of the photoresist layer 4, those material will be removed together with the photoresist layer 4 by the remover.

Step 250, an insulating protective material is coated on a surface of the conductive mesh 2 by a wet coating process, the insulating protective material is then cured to form the insulating protective layer 3, and a surface 33 of the insulating protective layer 3 away from the transparent substrate 1 is flat.

The insulating protective layer is made of at least one selected from the group consisting of thermoplastic polymer, a thermosetting polymer, or UV curable polymer. The surface 32 has a flatness of 0.1-1 μm/mm², preferably, 0.2-0.5 μm/mm².

In order not to affect the conductivity of the conductive mesh 2, a distance between the surface 32 of the insulating protective layer 3 and a surface of the conductive mesh 2 away from the transparent substrate 1 is less than 10 μm, preferably, less than 5 μm.

By forming the conductive mesh 2 on the surface of the transparent substrate, the transparent conductor 10 avoids the use of indium tin oxide, thus the cost of the transparent conductor 10 is lower. Since the insulating protective layer 3 is formed on the surface of the conductive mesh 2, the conductive mesh 2 is protected from being scratched.

The following specific embodiments are described below.

Embodiment One

Referring to FIG. 4, a method of preparing a transparent conductor includes the following specific steps:

1. A photoresist 4 was coated on a surface of a PET to form a photoresist layer.
2. The photoresist layer was exposed using a mask 5.
3. The photoresist layer was developed by a developing solution to obtain the desired pattern on the photoresist layer.
4. A conductive liquid was filled into the pattern lines obtained after development by scraping coating technique. Specifically, ① a conductive silver ink was coated on the surface of the photoresist, and the silver ink penetrated the pattern lines; ② the ink was cured using an IR drying system to obtain the conductive mesh 2.
5. The residual photoresist was removed by a remover.
6. A PMMA UV curing resin 3 was coated on the surface of the conductive mesh by wet coating, and then it was cured. A height difference of a surface of the PMMA and the conductive silver lines was controlled to be 2 μm. A curing wavelength of the PMMA UV curing resin was 365 nm, a viscosity of the PMMA UV curing resin is 600 cps, and the PMMA UV curing resin will not be cured until the cumulative radiation energy reaches 600 mj/cm$^2$ immediately.

Although the invention has been described in language specific to structural features and/or methodological acts, it is to be understood that the invention defined in the appended claims is not necessarily limited to the specific features or acts described. Rather, the specific features and acts are disclosed as sample forms of implementing the claimed invention.

What is claimed is:

1. A transparent conductor, comprising:
    a transparent substrate, a conductive mesh, and an insulating protective layer, which are laminated in that order,
    wherein the conductive mesh is formed on the transparent substrate, and a surface of the insulating protective layer away from the transparent substrate is flat,
    the conductive mesh comprising sets of first and second conductive lines oriented parallel to first and second directions, the first and second directions being transverse to one another, to create a plurality of voids arranged in an array;
    the array comprising first, second and third adjacent rows of voids extending parallel to the first direction;
    the first row comprising first and second voids adjacent to one another with a portion of a second line separating the first and second voids having a break, the second void located in the first direction relative to the first void;
    the second row comprising third and fourth voids adjacent to one another with a portion of a second line separating the third and fourth voids having a break, the fourth void located in the first direction relative to the third void;
    the third void being adjacent to the second void with a portion of a first line separating the second and third voids having a break, the third void located in the second direction relative to the second void;
    the third row comprising a fifth void adjacent to the fourth void with a portion of a first line separating the fourth and fifth voids having a break, the fifth void located in the second direction relative to the fourth void.

2. The transparent conductor according to claim 1, wherein the conductive mesh is made of at least one selected from the group consisting of metal, metal alloy, carbon nanotube, graphene, and conducting polymer.

3. The transparent conductor according to claim 1, wherein the transparent substrate is made of at least one selected from the group consisting of glass, polymethyl methacrylate, and polyethylene terephthalate.

4. The transparent conductor according to claim 1, wherein the insulating protective layer is made of at least one selected from the group consisting of thermoplastic polymer, a thermosetting polymer, or UV curable polymer.

* * * * *